(12) United States Patent
Secatch

(10) Patent No.: US 7,188,041 B1
(45) Date of Patent: Mar. 6, 2007

(54) QUEUE FOR SIMPLIFIED COMMUNICATION WITHIN A MULTITHREADED TESTBENCH

(75) Inventor: Stacey Secatch, Longmont, CO (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 11/131,752

(22) Filed: May 18, 2005

(51) Int. Cl.
  G06F 19/00 (2006.01)
  G06F 9/44 (2006.01)
(52) U.S. Cl. .................. 702/108; 702/119; 719/314
(58) Field of Classification Search ............ 702/108, 702/119, 121–123, 186, 187; 716/2, 3, 6, 716/16; 703/2, 17, 21; 719/313, 314; 714/30, 714/38
See application file for complete search history.

(56) References Cited

U.S. PATENT DOCUMENTS 6,466,898 B1 * 10/2002 Chan ........................ 703/17

2003/0191608 A1 * 10/2003 Anderson et al. ........... 702/189

* cited by examiner

*Primary Examiner*—Bryan Bui
(74) *Attorney, Agent, or Firm*—Kevin Cuenot (57) ABSTRACT

A multithreaded testbench configured to verify a device under test defined by hardware description language logic can include a test case for the testbench executing within a master thread and a generator executing within a sub-thread thread of the master thread. The generator can be configured to create test vectors to be provided to the device under test. The testbench further can include one or more additional modules executing within additional sub-thread(s) of the master thread and a command queue. The additional module (s) can interact with the device under test. The command queue can be configured to store a plurality of commands registered by the master thread. The generator can obtain individual ones of the plurality of commands from the command queue for execution.

17 Claims, 6 Drawing Sheets

QUEUE FOR SIMPLIFIED COMMUNICATION WITHIN A MULTITHREADED TESTBENCH

RESERVATION OF RIGHTS IN COPYRIGHTED MATERIAL

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

1. Field of the Invention

The present invention relates to the field of integrated circuits and, more particularly, to testing and verification of integrated circuit designs.

2. Description of the Related Art

Modern integrated circuits (ICs) are developed through the use of hardware description languages (HDLs). HDLs such as VERILOG, VHDL, and the like allow developers to create software-based representations of circuit designs. One advantage of using an HDL is the potential for code reuse from one design to another. This concept has been realized with the commercial availability of intellectual property (IP) cores. In general, an IP core refers to a software representation of a semiconductor, or a portion of a semiconductor, that provides a processing function.

Before HDL logic is made available for commercial use, it must be thoroughly tested and verified. The HDL logic must be tested to ensure that it functions properly and as expected, particularly as defined in the design specification. Typically, this testing is performed using a testbench. A testbench is a verification environment that is comprised of HDL descriptions. These HDL descriptions specify and verify the behavior of a device under test (DUT), in this case HDL logic such as one or more IP cores. In general, the testbench provides a pre-determined input sequence to the DUT and observes the response, or output from the DUT. Generating a testbench involves describing the connections, events, and test vectors for different combinations of transactions involving the DUT.

Figure 1:
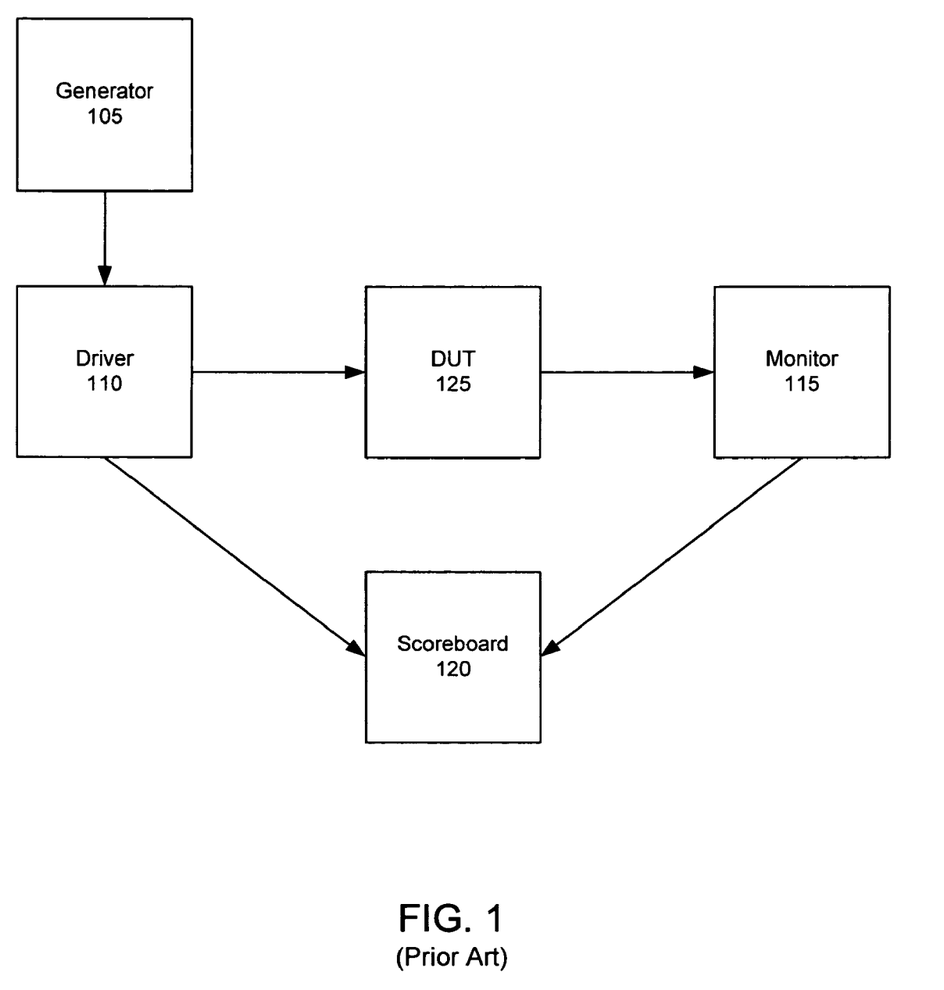
FIG. 1 is a schematic diagram illustrating an exemplary multithreaded testbench configuration.

FIG. 1 is a schematic diagram illustrating an exemplary multithreaded testbench configuration. The testbench can include a generator 105, a driver 110, a monitor 115, and a scoreboard 120, each being implemented as a software module or component. Typically, the testbench is multi-threaded in nature, with each of the aforementioned software components operating in a different thread of execution. These components interact with a DUT 125 to perform testing and/or verification.

In terms of functionality, the generator 105 randomly constructs data units to be provided to the DUT 125. The driver 110 can transmit the constructed data units to the DUT 125. The monitor 115 receives processed data units as output from the DUT 125, while the scoreboard 120 examines the output units to determine whether the DUT 125 behaved correctly.

In order to adequately test HDL logic, a series of different test cases are needed. Each test case is directed to testing a particular functionality of the HDL logic. Each test case includes a sequence of user specified commands. The testbench executes these commands, thereby causing particular inputs to be provided to the DUT 125.

Figure 2:
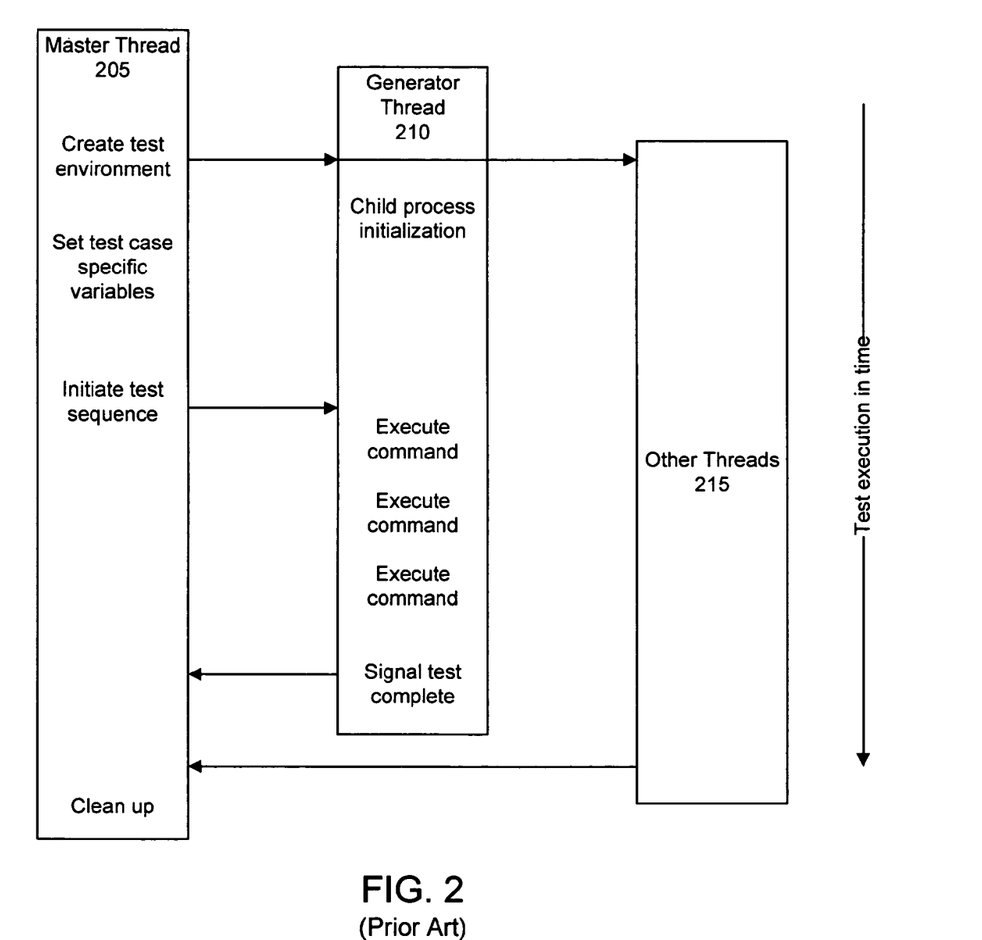
FIG. 2 is a block diagram illustrating one technique for implementing a multithreaded testbench.

FIG. 2 is a block diagram illustrating one technique for implementing a multithreaded testbench configuration. FIG. 2 further illustrates one manner of communication among the multiple threads of a testbench such as the one depicted in FIG. 1. As shown, the testbench configuration includes a master thread 205, a generator thread 210, and other threads 215 of the testbench. The master thread 205 represents a user specified test case. The generator thread 210 corresponds to a test case specific generator module. The other threads 215 are representative of the other modules of the testbench, such as the monitor, driver, and scoreboard, that may interact with a given DUT described.

The generator thread 210 and other threads 215 can be coded in an object oriented style such that each thread requires only a trigger input from the master thread 205 to begin executing. The master thread 205 initializes the generator thread 210 and the other threads 215. The master thread 205 then registers the commands of the user specified test case with the generator thread 210. The generator thread 210 begins executing the commands and the master thread 205 waits for each thread to complete.

One disadvantage of this technique is that a significant amount of time is required for testbench development. For each different test case to be executed, different testbench modules must be coded. Such is the case with the generator module executing in the generator thread 210, particularly as it is complex in nature. The master thread 205, by comparison, is less complex, but still must be recoded for each test case. Developing different sets of testbench modules for each test case significantly increases the amount of time needed for testing.

Figure 3:
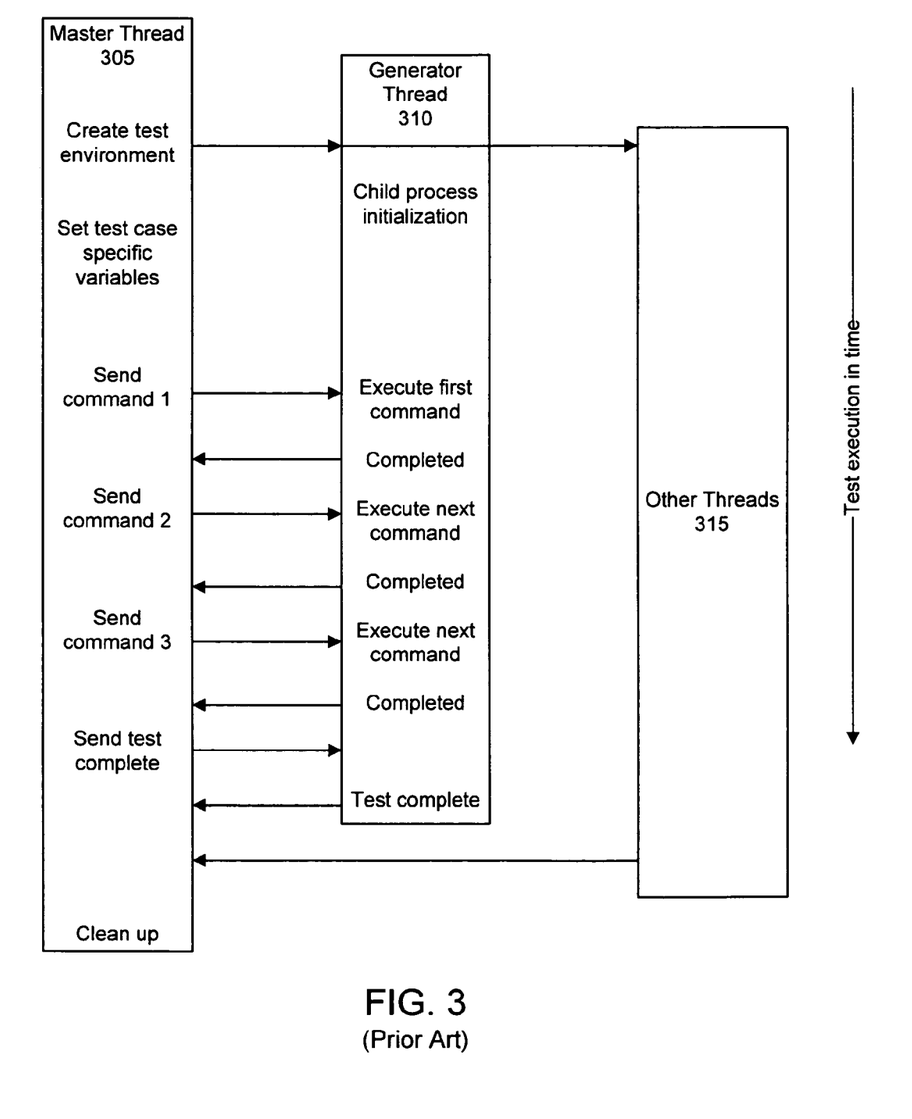
FIG. 3 is block diagram illustrating another technique for implementing a multithreaded testbench involving the use of semaphores.

FIG. 3 is block diagram illustrating another technique for implementing a multithreaded testbench involving the use of semaphores. Semaphores establish which of a plurality of different threads is permitted access to shared data at any given time. This prevents more than one thread from trying to access the same data at the same time, resulting in a fault condition referred to as a collision. As shown, the inter-thread communications are more complex than those illustrated in FIG. 2. A higher degree of handshaking is required between the master thread 305 and the generator thread 310.

Semaphores are particularly useful when randomization is introduced into the testing process. Randomization is used to vary the input vectors that are applied to the DUT. Not only is the content of the input vectors varied, but the length of the input vectors also can be randomized. Accordingly, rather then sending data packets having a constant size, for example 1 KB, data packets between 10 bytes and 4 KB may be provided to the DUT. Randomization facilitates better functional coverage by a test case with less effort on the part of the test engineer. When using randomization, the number of vectors and the time needed to transmit each vector cannot be predicted with any degree of accuracy. Determining when a next command is to be executed, therefore, is difficult. The use of semaphores between the master thread 305 and the generator thread 310 ensures that the generator thread 310 obtains a new command whenever it finishes execution of the previous command.

While this strategy for sharing common data does prevent collisions between threads, it also requires a significant amount of overhead. The handshaking that is needed to implement semaphores within a testbench environment requires both time and processing power. While one thread establishes a lock to write to the shared data, other threads execute in wait loops or are otherwise blocked from accessing the shared data until the owner thread releases the lock. Throughout the time a thread is blocked from executing, processing cycles are consumed as the blocked thread continues to check whether access to the shared data is available.

It would be beneficial to provide a technique for communication within a multithreaded testbench that overcomes the limitations described above.

SUMMARY OF THE INVENTION

The present invention provides a method and system for implementing a multithreaded testbench for testing and/or verifying a device under test (DUT). One embodiment of the present invention can include a system configured to verify a DUT comprised of hardware description language logic. The system can include a test case for a testbench executing within a master thread, a generator executing within a sub-thread of the master thread, and at least one additional module executing within at least one additional sub-thread of the master thread. The generator can be configured to create test vectors to be provided to the DUT, and the additional module(s) can interact with the DUT. The system further can include a command queue configured to store a plurality of commands registered by the master thread. The generator can obtain individual ones of the plurality of commands from the command queue for execution.

The master thread can maintain ownership of the command queue prior to execution of the plurality of commands. The master thread further can unroll complex commands into constituent commands that can be loaded into the command queue. The generator can determine when the command queue is empty and responsively notify the master thread that the command queue is empty.

In another embodiment, the generator can execute successive ones of the plurality of commands from the command queue without providing an intermediate communication to the master thread. The generator can maintain ownership of the command queue during execution of the plurality of commands. The generator also can modify the contents of the command queue during execution of at least one of the plurality of commands.

Another embodiment of the present invention can include a method of operating a multithreaded testbench environment. The method can include executing a master thread specifying a test case for the testbench, initializing variables specific to the test case, registering, within a command queue, a plurality of commands for the test case, and executing the plurality of commands within a different thread.

One or more parameters for at least one of the plurality of commands can be randomly selected prior to registering the plurality of commands within the command queue. The executing step can include instantiating a generator module for executing the plurality of commands. The generator can execute within the different thread. The method further can include altering the contents of the command queue while at least one of the plurality of commands from the command queue is being executed by the generator.

In one embodiment, the test case can specify at least one complex command. Accordingly, the registering step can include placing the complex command(s) into the command queue. In another embodiment, the registering step can include unrolling the complex command into the command queue such that constituent commands of the complex command are placed into the command queue.

Yet another embodiment of the present invention can include a method of implementing a multithreaded testbench including executing a master thread specifying a test case. The test case can specify a plurality of commands. A test environment comprising a command queue can be created. The command queue can be configured to receive the plurality of commands from the master thread. The method further can include registering the plurality of commands within the command queue and executing the plurality of commands from the command queue within a different thread. The master thread can initially own the command queue. Prior to the executing step, ownership of the command queue can be passed from the master thread to a generator which executes the commands.

The creating step can include instantiating a generator within the different thread and instantiating the command queue. Accordingly, the generator can perform the executing step within the different thread. The generator further can execute each of the plurality of commands responsive to a message from the master thread. The generator can provide an indication to the master thread only after each of the plurality of commands has been executed.

In one embodiment, one or more of the plurality of commands can be complex commands. Accordingly, the registering step can include unrolling the complex command (s) into the command queue. The method further can include performing at least one of pushing a new command onto a top of the command queue or popping one of the plurality of commands from the top of the command queue while at least one of the plurality of commands is being executed. Similarly, at least one of pushing a new command onto a bottom of the command queue or popping one of the plurality of commands from the bottom of the command queue can be performed while at least one of the plurality of commands is being executed.

BRIEF DESCRIPTION OF THE DRAWINGS

There are shown in the drawings, embodiments which are presently preferred, it being understood, however, that the invention is not limited to the precise arrangements and instrumentalities shown.

DETAILED DESCRIPTION OF THE INVENTION

The present invention provides a solution for implementing a multithreaded testbench. In accordance with the inventive arrangements disclosed herein, communications within a multithreaded testbench configuration can be facilitated through the use of a command queue. As such, the present invention provides a method of operation for a testbench which does not require the overhead associated with conventional testbench configurations, particularly those which utilize semaphores. In consequence, the task of creating test cases is simplified. Further, the ability to reuse testbench components from one test case to another is improved.

Figure 4:
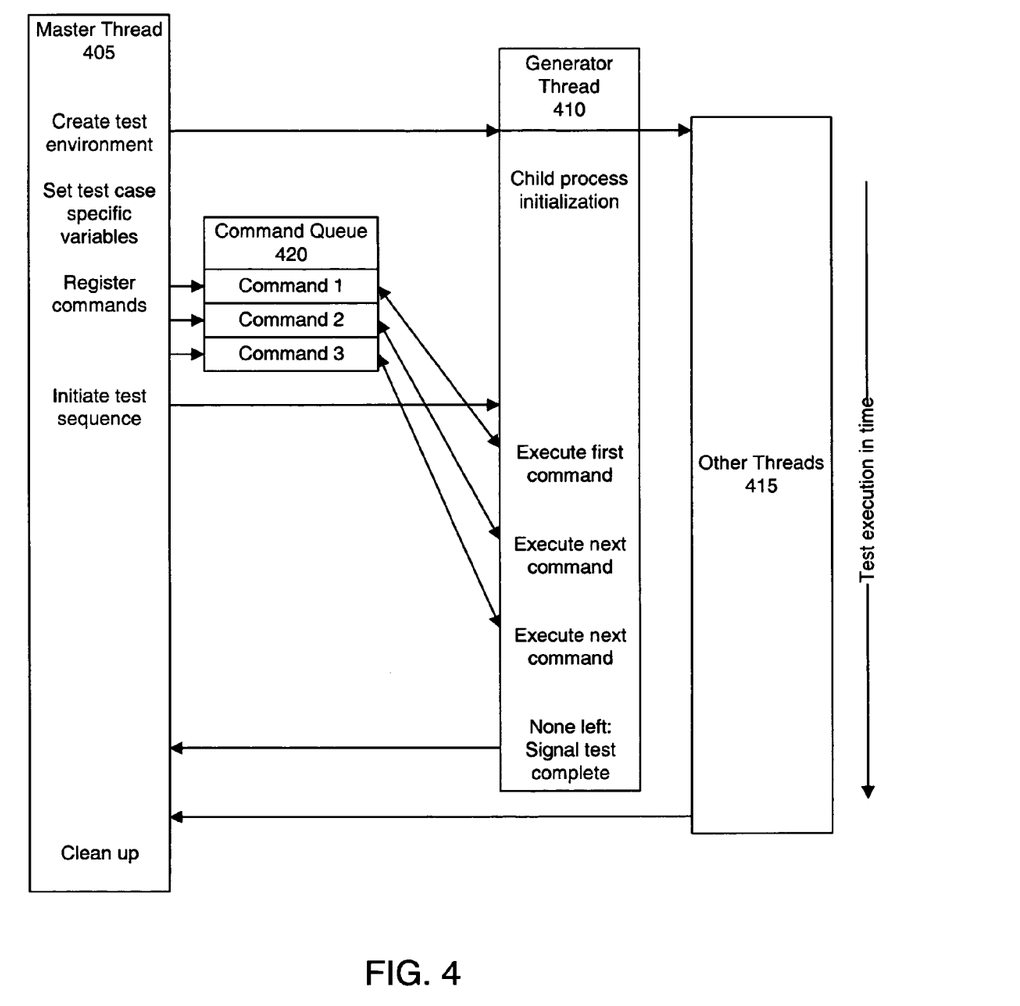
FIG. 4 is a block diagram illustrating a technique for implementing a multithreaded testbench in accordance with one embodiment of the present invention.

FIG. 4 is a block diagram illustrating a technique for implementing a multithreaded testbench in accordance with one embodiment of the present invention. As shown, the testbench includes a master thread 405, a generator thread 410, one or more other threads 415, and a command queue 420. The other threads can be representative of one or more monitor thread(s), driver thread(s), and/or scoreboard thread (s) as the case may be. Selected ones of the threads, i.e. the generator thread 410 and the monitor thread(s) can interact with a device under test (DUT). As used herein, a DUT can refer to a hardware description language (HDL) description of an integrated circuit or a portion of an integrated circuit. In one embodiment, the DUT can be an intellectual property (IP) core.

The master thread 405, which corresponds to the user's test case, begins executing and creates the test environment. More particularly, the master thread 405 can instantiate the generator thread 410, the other threads 415 included within the testbench, as well as the command queue 420. After instantiation of the sub-threads in the testbench, each sub-thread can begin executing and perform any initialization procedures necessary.

Any test case specific variables also can be initialized within the master thread 405. Variables and/or generics of the master thread 405 can be initialized as may be required for execution of the testbench. Any parameters of the commands which are to be randomized can be determined as well. These parameters can include, but are not limited to, the number of inputs to be provided to a DUT as well as the size of those inputs. The commands can be randomized using a randomization technique.

In one embodiment of the present invention, a Hardware Verification Language (HVL) having a randomization engine can be used. One example of an HVL having randomization capabilities is OpenVera™. OpenVera™ is a concurrent, imperative language designed for writing testbenches. It executes in concert with an HDL simulator and can provide stimulus to the simulator as well as observe the results. In addition to the conventional high-level imperative language constructs, such as conditionals, loops, functions, strings, and associative arrays, OpenVera™ provides extensive facilities for generating biased random patterns and monitoring what values particular variables take on during the simulation. It should be appreciated, however, that the present invention is not limited by the particular HVL used, so long as the selected HVL provides randomization functions substantially as described herein.

Randomization can be illustrated in the case of testing a Generic Framing Procedure (GFP) core. A GFP core typically implements GFP recommendation G.7041/Y.1303 from the International Telecommunication Union and generally includes a MAP core and an UNMAP core. The MAP core receives client network protocol data on the system interface, encapsulates this data, and transmits the resulting frames on the line interface. The UNMAP core performs a similar process in reverse. The UNMAP core receives encapsulated data on the line interface and de-maps the frames to extract client network protocol data. The network protocol data is, in turn, transmitted on the system interface.

To verify a GFP core, individual data frames are sent to the GFP core and the output from the core is observed. By coding portions of the testbench in an HVL, the commands that are placed into the command queue 420 can be randomized. Further, the individual data frames, i.e. inputs or test vectors, that are sent to the core can be randomized in terms of both content and length. The commands can be randomized prior to being registered within the command queue 420. These commands, when executed by the generator thread 410, cause frames to be sent to the DUT. The generator thread 410 randomizes any frames, as may be required, in terms of content and size if a size is not already specified by the command which caused the frame to be created. The final sequence of commands and/or frames to be executed by the child threads, i.e. the generator thread 410 and the sub-threads 415, is known only at runtime.

With reference to FIG. 4, each frame is caused by, and associated with, a command. Each of commands 1, 2, and 3 within the command queue 420 can cause a different frame to be sent to the GFP core. The user specified test case includes a listing of the individual commands that are to be registered within the command queue 420 and executed by the generator thread 410. Once the command queue 420 is loaded, the master thread 405 can initiate the test sequence by sending a notification to the generator thread 410. Accordingly, the generator thread 410 can begin retrieving and executing commands from the command queue 420. The generator thread 410 can execute the commands from the command queue 420 independently of the master thread 405 and any sub-threads, i.e. the generator thread 410 or the other threads 415.

In one embodiment of the present invention, the command queue 420 uses timing to prevent collisions between the master thread 405 and the generator thread 410. More specifically, while the command queue 420 is loaded by the master thread 405, the master thread 405 maintains ownership of the command queue 420. After the command queue 420 is loaded, ownership of the command queue 420 passes from the master thread 405 to the generator thread 410 so that the generator thread 410 can begin executing commands. This manner of determining ownership of the command queue 420 effectively prevents collisions between the threads.

The generator thread 410 can begin executing commands in the command queue 420. In executing commands, the generator thread 410 can create inputs to the DUT. This process can include creating random inputs, i.e. random frames. As the generator thread 410 completes execution of one command, a next command can be retrieved and executed from the command queue 420. When the command queue 420 is empty, the generator thread 410 can notify the master thread 405 that it has finished execution. As the other threads 415 complete execution, each can signal the master thread 405 that it has completed execution also. When each thread has signaled that it has completed execution, the master thread 405 can determine that the test is complete.

As can be seen from FIG. 4, the command queue 420, and its reliance upon timing for automatically passing control between threads of the testbench, effectively replaces semaphores as a means of regulating access to data in a multithreaded testbench environment. The command queue 420 prevents collisions within the master thread 405 in the event more than one thread attempts to access the data at a given time. Accordingly, the overhead typically associated with semaphores, i.e. the handshaking between the master thread 405 and any child threads, is eliminated.

The generator thread 410 can be implemented in a manner that facilitates its reuse among a plurality of different user specified test cases. Such is the case as the generator thread 410 is relieved from having to perform more complex handshaking operations typically associated with semaphores. The generator thread 410 simply executes one command after another from the command queue until no further commands remain. The commands are simple in structure, thereby allowing a common generator to be used across a plurality of different test cases. Accordingly, the generator thread 410 can be referred to as a common component in reference to its potential reuse within different test cases.

Though the present invention is discussed largely with reference to a GFP core having a MAP core and an UNMAP core, the present invention is not so limited. It should be appreciated that the present invention is applicable to other varieties of cores and/or DUTs and, as such, extends beyond the testing of a GFP core or its constituent cores.

Figure 5:
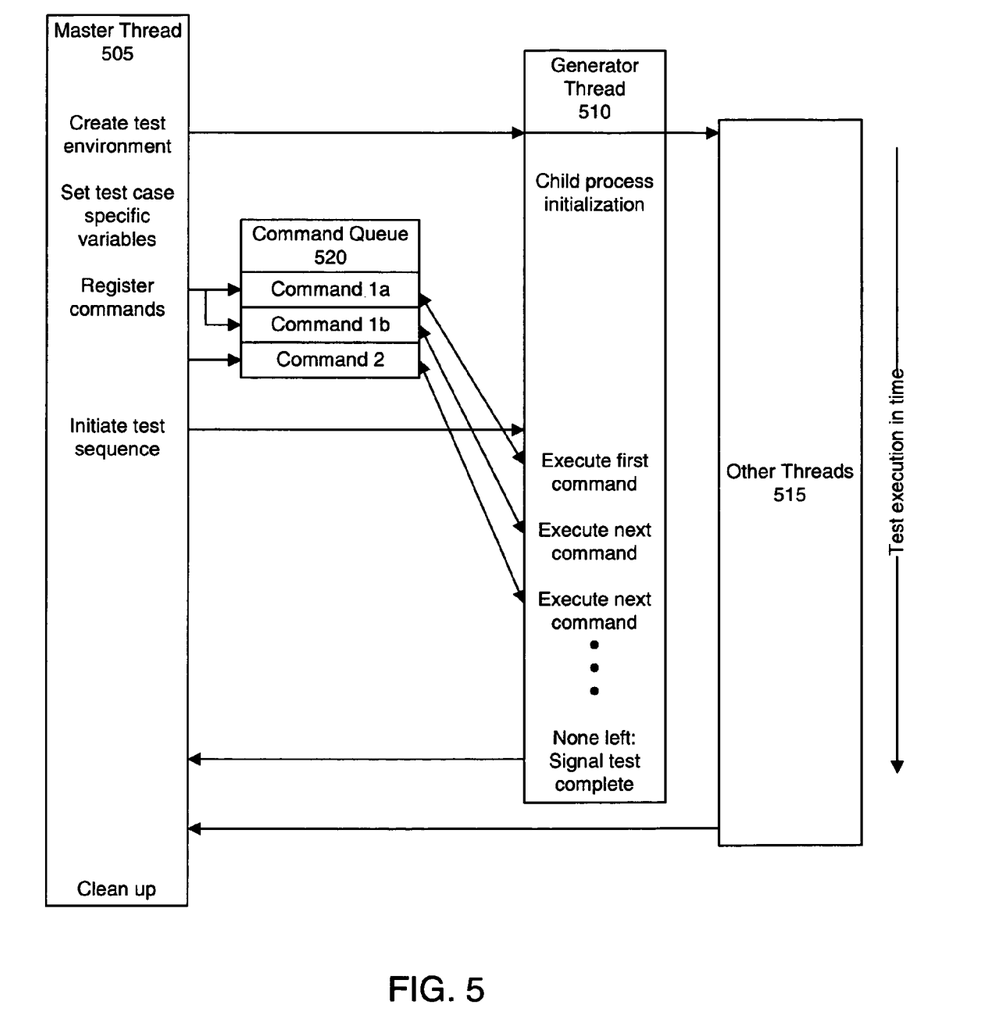
FIG. 5 is a block diagram illustrating a technique for implementing a multithreaded testbench in accordance with another embodiment of the present invention.

FIG. 5 is a block diagram illustrating a technique for implementing a multithreaded testbench in accordance with another embodiment of the present invention. As shown, the testbench configuration includes a master thread 505, a generator thread 510, one or more other common threads 515, as well as a command queue 520. The testbench configuration illustrated in FIG. 5 is similar to that of FIG. 4, with the exception that command unrolling is supported.

More particularly, rather than storing more complex testbench commands within the command queue 520, commands are "unrolled" prior to being placed into the command queue 520. In other words, the process of the master thread 505 registering the commands into the command queue 520 splits or unrolls a command into a series of one or more constituent commands. The unrolling process breaks down more complex commands into one or more simplified commands. Accordingly, the generator thread 510 need not understand complex testbench commands, but rather the simplified command structures that are unrolled into the command queue 520. As a result, the generator module can be more easily reused from one testbench to another. Further, command unrolling allows test engineers to program simple test cases which are capable of performing complex testing operations.

Table 1 illustrates example source code for a user specified test case. The source code corresponds to a testbench configured to test a GFP core and, as such, causes a series of GFP frames to be generated and sent to the core.

TABLE 1

Example Source Code for User Test Case

```
use_small_frames( );
set_data_type(incrementing);
for (i = 0; i < 2; i++) {
    send_data_frames(2)
    send_data_frames(1, 1000);
}
open_register_write( );
write_register(address1, value1);
write_register(address2, value2);
close_register_write( );
set_data_type(decrementing);
for (i = 0; i < 2; i++) {
    send_data_frames(2);
    send_data_frames(1, 1000);
}
```

The source code of Table 1 will produce a test sequence in which randomly sized GFP frames and fixed sized GFP frames are generated and sent. The test sequence begins with 2 data frames with random small size and incrementing data being sent. Here, the command specifies that a random sized frame will be used. This value can be determined prior to the commands being registered within the command queue 520. Next 1 data frame with a size of 1,000 and incrementing data is sent. These two operations are repeated as specified by the first for loop.

Next a sequence of register write operations is started by placing the core into software reset using the open_register_write( ); command. The value specified by symbolic constant value1 is written to the register location specified by symbolic constant address1. Similarly, the value specified by value2 is written to the register location specified by address2. The core can then be removed from software reset by the close_register_write( ); command. The next for construct repeats the same operations described with reference to the prior for construct.

When the master thread 520 is executed, it can create the test environment by instantiating the generator thread 510, the other threads 515, and the command queue 520. The master thread 505 further instructs each instantiated thread of the testbench to begin execution. Each child process, i.e. generator thread 510 and the other threads 515, can begin initialization and start executing. Within the master thread 505, test case specific variables can be initialized. The commands specified by the user test case can be registered within the command queue 520 by unrolling commands specified in the user test case as may be required.

By unrolling commands during the command registration process, the need for a more complex generator is avoided. The master thread 505 interprets the user test case and unrolls complex commands into the command queue. That is, commands that cause more than one action, or that can be broken down into more than one constituent command, can be unrolled into the command queue 520.

In illustration, the commands located within the first for construct of Table 1 are unrolled into commands 1a, 1b, and 2 within the command queue 520. In illustration, the command send_data_frames(2); causes two data frames with random small size and incrementing data to be sent. Rather than placing this complex command into the command queue 520, the master thread 505 can unroll the complex command into two simplified, constituent commands 1a and 1b. Command 1a causes the generator 510 to create one data frame of random small size and incrementing data that will be sent to the DUT. Likewise, command 1b causes the generator 510 to create a second data frame of random small size and incrementing data to be created and sent to the DUT.

Command 2 corresponds to the command send_data_frames(1, 1000);. As this command only causes one frame to be sent, the command is not broken down into any sub-parts. Still, it should be appreciated that if necessary, the commands can be translated into an intermediate format that is understandable by the generator 505. Thus, although the command is not unrolled, it still can be translated into a format that is understandable by the generator thread 510.

FIG. 5 illustrates only the first pass of the master thread 505 through the for construct. Though not shown, the master thread 505 can continue with a second pass through the for construct, at which point additional copies of commands 1a, 1b, and 2 will be unrolled into the command queue 520. Execution of the remainder of the source code illustrated in Table 1 can continue as discussed. In any case, the command queue 520 is shown to specify commands 1a, 1b, and 2 for purposes of illustration only. It should be appreciated that the command queue 520 can be large enough to accommodate further commands as set forth by the user specified test case as may be required.

After registration, each command that was part of a loop construct is independently specified within the command queue 520 as was the case with reference to FIG. 4. Accordingly, the generator thread 510 need not have the ability to process the more complex command structures of the user test case illustrated in Table 1, but rather the simplified command structures that are stored within the command queue 520. The testbench can continue execution as described with reference to FIG. 4 until the test is complete.

Figure 6:
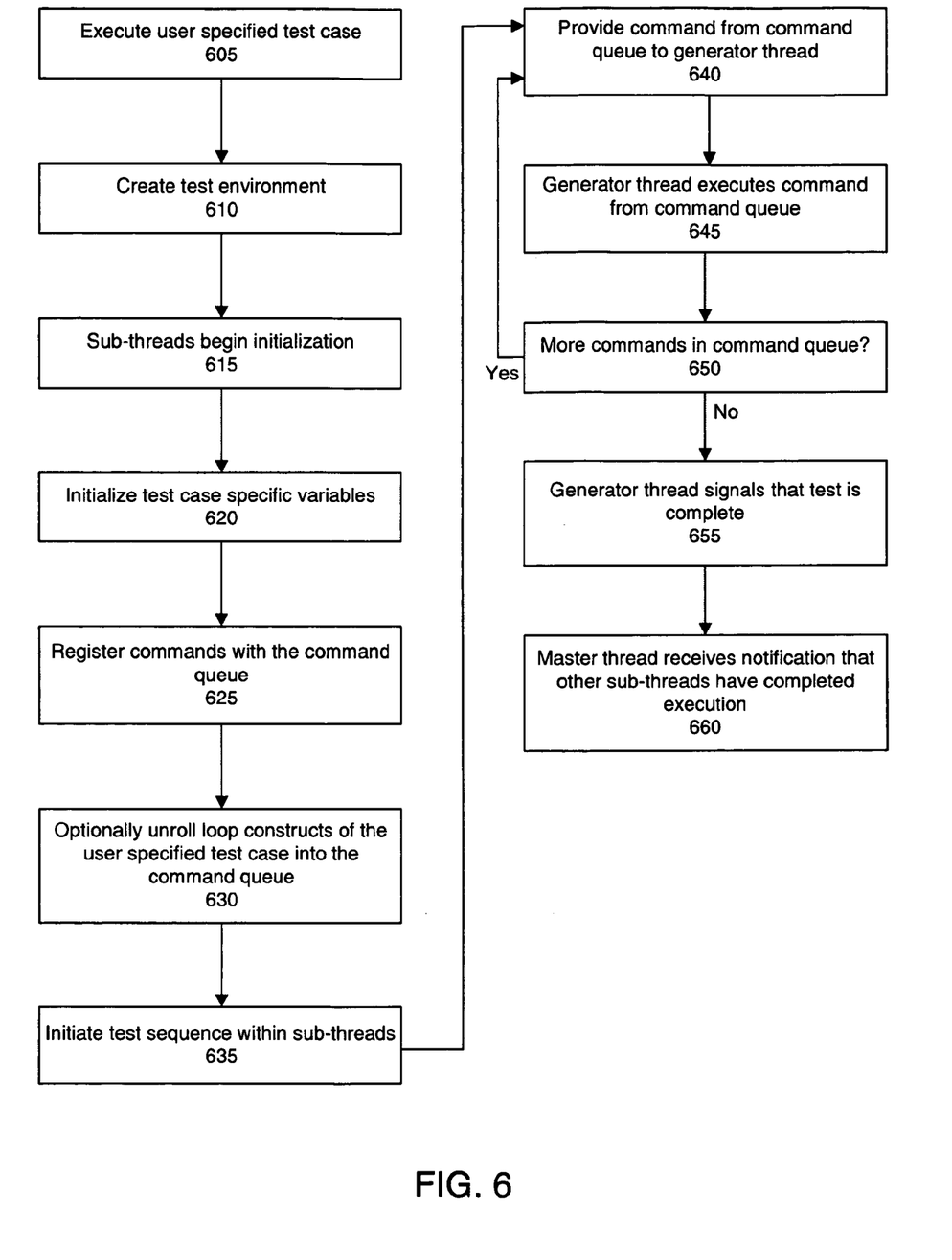
FIG. 6 is a flow chart illustrating a method of implementing a multithreaded testbench in accordance with the inventive arrangements disclosed herein.

FIG. 6 is a flow chart illustrating a method of implementing a multithreaded testbench in accordance with the inventive arrangements disclosed herein. The method can begin in a state where a user specified testbench is created. In one embodiment, the testbench can be specified in an HVL having a randomization engine. The testbench can be loaded within a suitable information processing system. Thus, in step 605, the user specified test case can be executed. The master thread of the testbench is representative of the user specified test case.

In step 610, the master thread creates the test environment. The master thread instantiates one or more different modules of the test bench. Each module can execute within its own thread. In illustration, a generator module can be instantiated and begin executing within a generator thread. Similarly, driver, monitor, and scoreboard modules can be instantiated, each within its own thread. Additional modules can be instantiated if so desired, such as additional monitor, driver, and/or scoreboard modules. The inclusion of such additional modules can depend upon the testbench configuration and/or user specified test case. The master thread further can instantiate, or create, a command queue. The command queue serves as a repository for commands of the user specified test case that will be executed or accessed by one or more of the modules of the testbench. As noted, during this time the master thread maintains ownership of the command queue.

In step 615, the threads instantiated by the master thread, i.e. the sub-threads, can begin initialization. Each of the sub-threads can begin executing and initialize any variables or other data structures required for testing and/or interacting with the DUT. In step 620, the master thread initializes any test case specific variables. Any variables or generics of the master thread can be initialized as may be required for execution of the testbench. Further, any command parameters which are to be randomized can be determined at this time. In illustration, if the testbench implements a verification procedure for a GFP core, values for the number of commands to be placed into the command queue and/or the size of the frames to be provided to the DUT can be determined using a randomization technique.

In step 625, commands to be executed as defined in the user specified test case can be registered with the command queue. In one embodiment, each command can be registered within the command queue on an individual basis as was described with reference to FIG. 4. Step 630 is optional and can be executed in cases where commands are to be unrolled into the command queue as demonstrated with reference to FIG. 5. In such cases, the commands can be unrolled so that the simplified commands, i.e. the constituent parts of complex commands, are registered into the command queue.

In step 635, the master thread can initiate the test sequence by instructing the sub-threads to begin executing commands from the command queue. In step 640, a command is provided to the generator thread. The command generally notifies the generator thread that it can begin executing commands. Further, the notification can indicate that ownership of the command queue is being passed from the master thread to the generator thread. Accordingly, in step 645, having obtained control and/or ownership of the command queue, the generator thread executes the command. As noted, the generator thread can create the input to be provided to the DUT in accordance with any parameters of the commands. Further, other data fields of the input can be randomized if necessary. That is, the generator thread can randomly select values to be applied to such fields. In step 650, a determination can be made as to whether any further commands are left within the command queue. If so, the method can loop back to step 640 where further commands can be provided to the generator thread and executed as may be required.

In another embodiment of the present invention, the generator can add additional commands to the command queue during execution as well as remove one or more commands from the testbench during execution. Thus, the contents of the command queue can be altered as the generator executes commands, i.e. while the testbench executes. This ability to edit the contents of the command queue allows the test engineer to introduce feedback into the testbench configuration. Further, collisions are avoided as ownership of the command queue remains with the generator, the same entity that is tasked with making any changes to the command queue content. The generator can modify the command queue content based upon information that is obtained during execution of the testbench, whether such information is determined by the generator itself or obtained from another module of the testbench. Thus, depending upon an evaluation of one or more defined attributes which gauge the progress or status of the test case, commands can be added to, or removed from, the command queue.

If no further commands remain in the command queue, the method can proceed to step 655, where the generator thread signals the master thread that the test is complete. It should be appreciated that other threads within the testbench can notify the master thread when each has completed execution as well. In step 660, the master thread can receive notification from the sub-threads that execution has completed.

In another embodiment, such as where a more complex coding language is used, the command queue can be manipulated using push or pop instructions. A language such as OpenVera™ can support complex data types. Accordingly, after the master thread constructs the command queue, the generator thread can manipulate the command queue through the use of pop and/or push instructions. Such a configuration allows the generator to execute complex subroutines by pushing new commands onto the command queue or popping commands off of the command queue during execution of the testbench, i.e. while commands from the command queue are being executed.

It should be appreciated that push and/or pop operations can be performed with respect to either end of the command queue. That is, commands can be pushed and/or popped from the beginning (top) of the command queue or the end (bottom) of the command queue as may be desired. Accordingly, one or more commands can be added to the beginning or the end of the command queue. Similarly, one or more commands can be removed from the beginning or end of the command queue. Through the use of multiple push and pop instructions, commands also can be added to, or removed from, the middle of the command queue.

In illustration, again referring to a testbench for a GFP core, the generator can be configured to place a specific number of commands in the command queue which cause synchronization frames to be sent to the DUT. This function would be useful in cases where the generator determines that a particular frame is likely to, or will, break synchronization with the DUT. The commands can be inserted at the appropriate location within the command queue using pop and/or push commands to ensure that synchronization is maintained during testing.

The present invention provides a solution for inter-thread communication within a testbench environment. In accordance with the inventive arrangements, a command queue is used to distribute commands from a master thread to one or more sub-threads. The command queue effectively relieves the testbench of the overhead associated with the use of semaphores for preventing collisions when accessing data that is to be shared among a plurality of threads.

The present invention can be realized in hardware, software, or a combination of hardware and software. The present invention can be realized in a centralized fashion in one computer system, or in a distributed fashion where different elements are spread across several interconnected computer systems. Any kind of computer system or other apparatus adapted for carrying out the methods described herein is suited. A typical combination of hardware and software can be a general purpose computer system with a computer program that, when being loaded and executed, controls the computer system such that it carries out the methods described herein.

The present invention also can be embedded in a computer program product, which comprises all the features enabling the implementation of the methods described herein, and which when loaded in a computer system is able to carry out these methods. Computer program, software, application, or any variant thereof, in the present context, means any expression, in any language, code or notation, of a set of instructions intended to cause a system having an information processing capability to perform a particular function either directly or after either or both of the following: a) conversion to another language, code, or notation; b) reproduction in a different material form.

This invention can be embodied in other forms without departing from the spirit or essential attributes thereof. Accordingly, reference should be made to the following claims, rather than to the foregoing specification, as indicating the scope of the invention.

What is claimed is:

1. A system configured to verify a device under test comprised of hardware description language logic, said system comprising:
   a test case of a testbench executing within a master thread;
   a generator executing within a sub-thread of the master thread, wherein said generator is configured to create test vectors to be provided to the device under test;
   at least one additional module executing within at least one additional sub-thread of the master thread, wherein said at least one additional module interacts with the device under test and indicates behavior of the device under test resulting from application of the test vectors; and
   a command queue configured to store a plurality of commands registered by the master thread, wherein said generator obtains individual ones of the plurality of commands from said command queue for execution, wherein said generator creates the test vectors to be provided to the device under test responsive to execution of individual ones of the plurality of commands from the command queue,
   wherein said generator modifies the content of said command queue during execution of at least one of the plurality of commands.

2. The system of claim 1, wherein the master thread maintains ownership of the command queue prior to execution of the plurality of commands.

3. The system of claim 2, wherein the master thread is configured to unroll complex commands into constituent commands that are loaded into said command queue.

4. The system of claim 3, wherein said generator determines when said command queue is empty and responsively notifies the master thread that said command queue is empty.

5. The system of claim 1, wherein said generator executes successive ones of the plurality of commands from said command queue without providing an intermediate communication to the master thread.

6. The system of claim 1, wherein said generator maintains ownership of the command queue during execution of the plurality of commands.

7. A method of operating a multithreaded testbench environment comprising:
   executing a master thread specifying a test case for the testbench;
   initializing variables specific to the test case;
   registering, within a command queue, a plurality of commands for the test case;
   executing the plurality of commands within a different thread to create test vectors to be provided to a device under test;
   indicating behavior of the device under test resulting from application of the test vectors; and
   randomly selecting at least one parameter for at least one of the plurality of commands prior to registering the plurality of commands within the command queue.

8. The method of claim 7, said executing step comprising instantiating a generator for executing the plurality of commands, wherein the generator executes in the different thread.

9. The method of claim 8, further comprising altering the contents of the command queue while at least one of the plurality of commands from the command queue is being executed by the generator.

10. The method of claim 7, wherein the test case specifies at least one complex command, said registering step comprising placing the at least one complex command into the command queue.

11. The method of claim 7, wherein the test case specifies at least one complex command, said registering step comprising unrolling the complex command into the command queue such that the constituent commands of the complex command are placed into the command queue.

12. A method of implementing a multithreaded testbench environment comprising:
   executing a master thread specifying a test case, wherein the test case defines a plurality of commands;
   creating a test environment comprising a command queue configured to receive the plurality of commands from the master thread;
   registering the plurality of commands within the command queue;
   executing the plurality of commands from the command queue within a different thread to create test vectors to be provided to a device under test;
   indicating behavior of the device under test resulting from application of the test vectors; and
   performing at least one of pushing a new command onto a top of the command queue or popping one of the plurality of commands from the top of the command queue while at least one of the plurality of commands is being executed.

13. The method of claim 12, said creating step comprising instantiating a generator within the different thread and instantiating the command queue, wherein the generator performs said executing step within the different thread.

14. The method of claim 13, further comprising the generator executing each of the plurality of commands responsive to a message from the master thread, wherein the generator provides an indication to the master thread only after each of the plurality of commands has been executed.

15. The method of claim 13, wherein the master thread initially owns the command queue, said method further comprising, prior to said executing step, passing ownership of the command queue from the master thread to the generator.

16. The method of claim 12, further comprising performing at least one of pushing a new command onto a bottom of the command queue or popping one of the plurality of commands from the bottom of the command queue while at least one of the plurality of commands is being executed.

17. The method of claim 12, wherein at least one of the plurality of commands is a complex command, said registering step comprising unrolling the at least one complex command into the command queue.

* * * * *